(12) United States Patent
Wan et al.

(10) Patent No.: US 11,645,090 B2
(45) Date of Patent: May 9, 2023

(54) METHOD AND APPARATUS FOR RESOURCE MANAGEMENT IN EDGE CLOUD

(71) Applicant: NOKIA SOLUTIONS AND NETWORKS OY, Espoo (FI)

(72) Inventors: Yan Wan, Shanghai (CN); Chaohua Gong, Shanghai (CN)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 168 days.

(21) Appl. No.: 16/625,287

(22) PCT Filed: Jun. 23, 2017

(86) PCT No.: PCT/CN2017/089812
§ 371 (c)(1),
(2) Date: Dec. 20, 2019

(87) PCT Pub. No.: WO2018/232746
PCT Pub. Date: Dec. 27, 2018

(65) Prior Publication Data
US 2020/0218548 A1  Jul. 9, 2020

(51) Int. Cl.
*G06F 9/445* (2018.01)
*G06F 30/34* (2020.01)
(Continued)

(52) U.S. Cl.
CPC ............ *G06F 9/44505* (2013.01); *G06F 1/28* (2013.01); *G06F 9/505* (2013.01); *G06F 9/5061* (2013.01);
(Continued)

(58) Field of Classification Search
CPC .... G06F 30/34; G06F 9/44505; G06F 9/5061; G06F 9/505; G06F 9/5077; G06F 1/28;
(Continued)

(56) References Cited

U.S. PATENT DOCUMENTS 7,328,335 B1 * 2/2008 Sundararajan ...... G06F 15/7867
710/8
8,121,826 B1 * 2/2012 Neely ................... G06F 30/327
717/109
(Continued)

FOREIGN PATENT DOCUMENTS

CN 102135951 A 7/2011
CN 102667724 A 9/2012
(Continued)

OTHER PUBLICATIONS

Wang et al., "On-line Thermal-aware Task Management for 3D Dynamically Partially Reconfigurable Systems", 2013 IEEE International Conference on Embedded and Real-Time Computing Systems and Applications, pp. 111-120. Downloaded on Dec. 10, 2021 from IEEE Xplore. (Year: 2013).*
(Continued)

*Primary Examiner* — Imad Hussain
*Assistant Examiner* — Sandarva Khanal
(74) *Attorney, Agent, or Firm* — Squire Patton Boggs (US) LLP

(57) ABSTRACT

A method can include obtaining information on at least one of the following: resource occupation of a reconfigurable functional unit associated with hardware accelerator resources or GPP resources, power consumption of a hardware accelerator associated with hardware accelerator resources, and power consumption of a server associated with GPP resources. The method can also include performing processing on the reconfigurable functional unit based on the obtained information, the processing including at least one of configuration, reconfiguration, and migration. The method and apparatus of certain embodiments may increase efficiency of resource management of the edge cloud, lower system energy consumption, and/or enable
(Continued)

more efficient virtualization mechanisms for hardware accelerator resources.

8 Claims, 9 Drawing Sheets

(51) Int. Cl.
  *G06F 9/50* (2006.01)
  *G06F 11/30* (2006.01)
  *G06F 1/28* (2006.01)
(52) U.S. Cl.
  CPC ........ *G06F 9/5077* (2013.01); *G06F 11/3041* (2013.01); *G06F 11/3062* (2013.01); *G06F 30/34* (2020.01); *G05B 2219/15057* (2013.01)
(58) Field of Classification Search
  CPC ............. G06F 15/7867; G06F 15/7871; G06F 30/331; G06F 11/267; G06F 15/7889; G06F 15/7892; G06F 15/80; G05B 2219/15057; H04L 41/0896; H04L 41/0833
  See application file for complete search history.

(56) References Cited

U.S. PATENT DOCUMENTS

| | | | |
|---|---|---|---|
| 2008/0028187 A1 | 1/2008 | Casselman et al. | |
| 2011/0082994 A1* | 4/2011 | Dasu .................. | G06F 15/7871 711/E12.001 |
| 2011/0161972 A1 | 6/2011 | Dillenberger et al. | |
| 2014/0328178 A1 | 11/2014 | Haberland et al. | |
| 2016/0321113 A1* | 11/2016 | Pinto ..................... | G06F 9/4856 |
| 2018/0089132 A1* | 3/2018 | Atta ..................... | G06F 15/7867 |
| 2018/0234383 A1* | 8/2018 | Daugherty ............ | G06F 13/385 |
| 2018/0246768 A1* | 8/2018 | Palermo ................. | H04L 67/10 |
| 2018/0343567 A1* | 11/2018 | Ashrafi ............... | H04L 41/0816 |

FOREIGN PATENT DOCUMENTS

| | | | |
|---|---|---|---|
| CN | 103238136 A | 8/2013 | |
| CN | 103947248 A | 7/2014 | |
| CN | 104657215 A | 5/2015 | |
| CN | 205003656 U | 1/2016 | |
| EP | 3327949 A1 * | 5/2018 | ........... H03F 1/3247 |
| EP | 2 781 116 B1 | 10/2019 | |
| EP | 3654593 A1 * | 5/2020 | ............. H04L 45/42 |
| WO | WO-0122235 A1 * | 3/2001 | ........ G06F 15/7867 |
| WO | 2013/072108 A1 | 5/2013 | |
| WO | WO-2013181654 A1 * | 12/2013 | ............ H04W 24/00 |
| WO | 2016/054183 A1 | 4/2016 | |
| WO | WO-2016054183 A1 * | 4/2016 | ............. H04L 41/12 |
| WO | WO-2016085679 A1 * | 6/2016 | ............. G06F 12/023 |
| WO | WO-2017037687 A1 * | 3/2017 | ............. H04L 67/10 |
| WO | WO-2018031057 A1 * | 2/2018 | |
| WO | WO-2018037286 A1 * | 3/2018 | ......... G06F 9/45558 |

OTHER PUBLICATIONS

Hsiung et al., "Scheduling and Placement of Hardware/Software Real-Time Relocatable Tasks in Dynamically Partially Reconfigurable Systems", ACM Transactions on Reconfigurable Technology and Systems, vol. 4, No. 1, Article 9, Pub. date: Dec. 2010. (Year: 2010).*
Blodget et al., "A lightweight approach for embedded reconfiguration of FPGAs", 2003 IEEE (Year: 2003).*
Tong et al., "A Hierarchical Edge Cloud Architecture for Mobile Computing", IEEE INFOCOM 2016—The 35th Annual IEEE International Conference on Computer Communications (Year: 2016).*
Wu et al., "Cloud Radio Access Network (C-RAN): A Primer", IEEE Network; Jan./Feb. 2015 (Year: 2015).*
Checko et al., "Cloud RAN for Mobile Networks—A Technology Overview", IEEE Communications Surveys & Tutorials (vol. 17, Issue: 1), DOI: 10.1109/COMST.2014.2355255, pp. 405-426, Sep. 12, 2014 (Year: 2014).*
Eckel et al., "Embedded multi-core systems for mixed criticality applications in dynamic and changeable real-time environments", Dec. 19, 2014, Retrieved online from https://www.artemis-emc2. eu/fileadmin/user_upload/Publications/Deliverables/EMC2_D4.2_ Specification_Demonstrator_Platform_v1_0_Final.pdf (Year: 2014).*
International Search Report and Written Opinion dated Sep. 27, 2017 corresponding to International Patent Application No. PCT/CN2017/089812, and partial English translation thereof.
Extended European Search Report dated May 18, 2020 corresponding to European Patent Application No. 17914467.0.
Athina Markopoulou et al.: "FlexRAN: A Flexible and Programmable Platform for Software-Defined Radio Access Networks," Proceedings of the 12th International on Conference on Emerging Networking Experiments and Technlogies, CONEXT '16; Dec. 12-15, 2016, Dec. 6, 2016, pp. 427-441, XP055693142.
Dario Pompili et al.: "Dynamic provisioning and allocation in Cloud Radio Access Networks (C-RANs)," Ad Hoc Networks, vol. 30, Jul. 30, 2015, pp. 128-143, XP055255264.
Wenfei Wu et al.: "PRAN", Proceedings of the 13th ACM Workshop on Hot Topics in Networks, HOTNETS-XIII, Oct. 27, 2014, pp. 1-7, XP055278892.
Communication pursuant to Article 94(3) EPC dated May 9, 2022 corresponding to European Patent Application No. 17914467.0.
First Office Action dated Nov. 10, 2022 corresponding to Chinese Patent Application No. 201780091555.3, with partial English Summary thereof.
"Exploration of the energy-efficient cloud computing resource scheduling model and algorithm based on CSP," Journal of Taiyuan Urban Vocational College, China Academic Journal Electronic Publishing House, pp. 173-175, Dec. 2015.
"Hardware/Software Tasks Management for Implementation of Reconfigurable System Based on μC/OS—II," Xiang Lei Tang et al., Journal of Hangzhou Dianzi University, vol. 31, No. 1, China Academic Journal Electronic Publishing House, Feb. 2011.

* cited by examiner

METHOD AND APPARATUS FOR RESOURCE MANAGEMENT IN EDGE CLOUD

FIELD

Embodiments of the present disclosure generally relate to an edge cloud, and more specifically, to a method, an apparatus and a computer program product for resource management in an edge cloud.

BACKGROUND

An edge cloud will be a solution for a future wireless cellular communication system including mobile edge computing (MEC) and a cloud radio access network (RAN). Characteristics of an edge cloud can be as follows: edge computing, centralized processing, virtualization, dynamical computing resources management, and multi-standard and multi-RAT support.

In an edge cloud architecture, a pure general-purpose process (GPP) platform cannot meet real time performance requirements which is a main feature of traditional RAN system. Research has shown that adding hardware accelerators to the GPP platform is a sort of potential option for edge cloud hardware architecture. For instance, a physical layer which has high real-time requirements and complicated encryption algorithms can be implemented in hardware accelerators, while other layers and functions of the RAN can be implemented in the GPP platform. The GPP resources and hardware accelerator resources (and probably other types of resources) constitute a heterogeneous computing resource pool in the edge cloud.

SUMMARY

Embodiments of the present disclosure provide a method, an apparatus, a computer-readable storage medium and a computer program product for resource management in an edge cloud. A brief overview of various embodiments is given below to provide a basic understanding of some aspects of the various embodiments. The summary is not intended to identify key points of the essential elements or to describe the scope of various embodiments. On the contrary, the content described herein is only for the purpose of presenting some concepts in a simplified form as a prelude to the detailed description below.

In accordance with the first aspect of the present disclosure, it provides an apparatus for managing resources in an edge cloud architecture, the resources comprising hardware accelerator resources, the hardware accelerator resources comprising a reconfigurable partition with an external data interface, and the apparatus comprising: an external control interface separated from the external data interface, a partial reconfiguration core (PRC) coupled to the external control interface, and an Internet content adaptation protocol (ICAP) port connected to the reconfigurable partition; wherein the PRC is configured to: receive configuration control signaling and an image of a reconfigurable module (RM) via the external control interface, and to perform, based on the configuration control signaling and via the ICAP port, configuration or reconfiguration of the RM in the reconfigurable partition selected from the reconfigurable partition.

In one embodiment, the hardware accelerator resources comprise a plurality of reconfigurable partitions and each of the plurality of reconfigurable partitions has a separate external data interface.

In another embodiment, the hardware accelerator resources are hardware resources based on a field programmable gate array (FPGA).

In another embodiment, the configuration control signaling is generated based on information on resource occupation of the RM and/or information on power consumption of the hardware accelerator.

In accordance with the second aspect of the present disclosure, it provides a method of managing resources in an edge cloud architecture, the resources comprising hardware accelerator resources and general-purpose processing (GPP) resources, the method comprising: obtaining information on at least one of the following: resource occupation of a reconfigurable functional unit associated with the hardware accelerator resources or the GPP resources, power consumption of a hardware accelerator associated with the hardware accelerator resources, and power consumption of a server associated with the GPP resources; and performing processing on the reconfigurable functional unit based on the obtained information, the processing including at least one of configuration, reconfiguration, and migration.

In accordance with the third aspect of the present disclosure, it provides a method of managing resources in an edge cloud architecture, the resources comprising hardware accelerator resources and general-purpose processing (GPP) resources, and the edge cloud architecture further comprises a first agent associated with the hardware accelerator resources and a second agent associated with the GPP resources. The method is implemented at the first agent and the second agent and, comprising: receiving a resource occupation and power consumption report request from a resource controller; and in response to the received resource occupation report and power consumption report request, sending a resource occupation and power consumption report related to the associated resources to the resource controller.

In accordance with the fourth aspect of the present disclosure, it provides a method of managing resources in an edge cloud architecture, the resources comprising hardware accelerator resources and general-purpose processing (GPP) resources, the method comprising: receiving an initial deployment request from a resource controller, the initial deployment request comprising a list of reconfigurable functional units; and sending, to the resource controller, resource occupation and power consumption information on the reconfigurable functional units comprised in the list.

In accordance with the fifth aspect of the present disclosure, it provides an apparatus; the apparatus comprises corresponding components for executing operations in the method of the second aspect of the present disclosure.

In accordance with the sixth aspect of the present disclosure, it provides an apparatus; the apparatus comprises corresponding components for executing operations in the method of the third aspect of the present disclosure.

In accordance with the seventh aspect of the present disclosure, it provides an apparatus; the apparatus comprises corresponding components for executing operations in the method of the fourth aspect of the present disclosure.

In accordance with the eighth aspect of the present disclosure, it provides an apparatus; the apparatus comprises corresponding components for executing operations in the method of the second, the third and the fourth aspects of the present disclosure.

In accordance with the ninth aspect of the present disclosure, it provides a computer-readable storage medium with program code stored therein, which when executed by an apparatus causes the apparatus to perform a method according to any one of the second to fourth aspects of the present disclosure.

In accordance with the tenth aspect of the present disclosure, it provides an edge cloud system including at least one of the apparatuses according to the first aspect, the fifth and the eighth aspects of the present disclosure.

The method, apparatus, computer-readable storage medium, computer program product, or edge cloud system of the embodiments of the present disclosure enable new virtualization for hardware accelerator resources and/or enable resource management of the edge cloud more efficiently and with lower system energy consumption.

Although specific embodiments are shown by way of example in the drawings, it should be understood that the description of specific embodiments herein is not intended to limit the embodiments to the specific forms disclosed.

BRIEF DESCRIPTION OF THE DRAWINGS

From the disclosure and claims below, the aim, advantages and other features of the present disclosure will become more apparent. For the purpose of example only, a non-limiting description of an exemplary embodiment is given with reference to the drawings, in which:

DETAILED DESCRIPTION OF EMBODIMENTS

Figure 1:
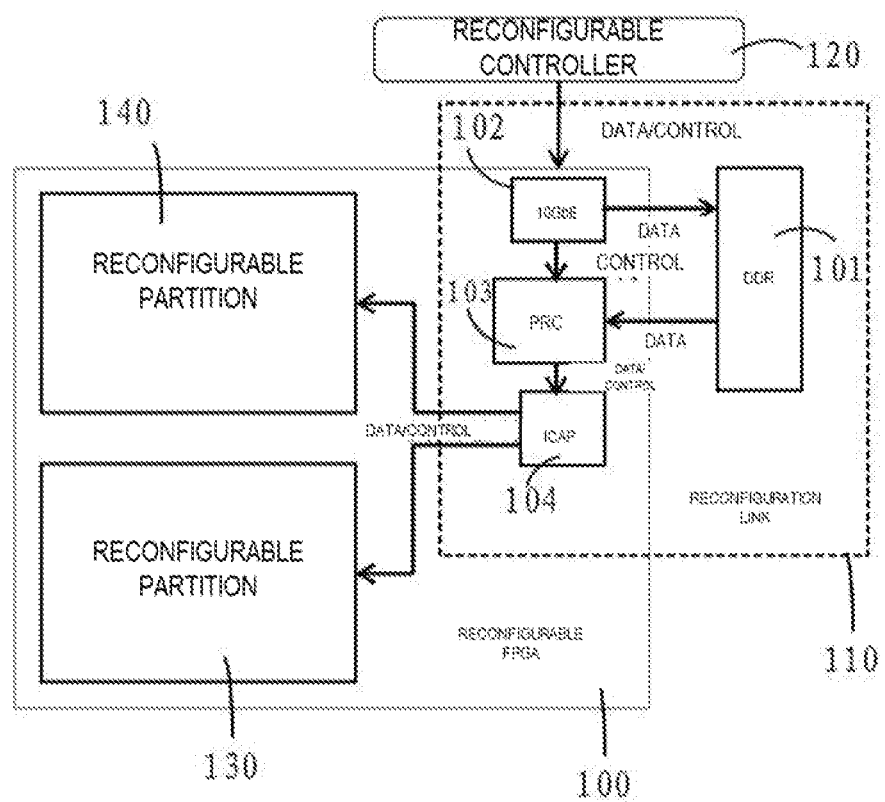
FIG. 1 is a schematic diagram illustrating an alternative scheme for virtualization of a hardware accelerator.

In the following description, many details are set forth for the purpose of illustration. However, the ordinary person skilled in the art will recognize that embodiments of the present disclosure may be implemented without these specific details. Therefore, the present disclosure is not intended to be limited to the illustrated embodiments, but will be given the broadest scope consistent with the principles and features described herein.

It should be understood that references to "one embodiment", "an embodiment", "exemplary embodiment", etc. in the specification merely indicate that the described embodiments may include specific features, structures, or characteristics, but do not require each include that particular feature, structure, or characteristic. Moreover, such phrases are not necessarily referring to the same embodiment. In addition, all of these embodiments are given only for those skilled in the art to better understand and further implement the disclosure, and are not intended to limit the scope of the disclosure. For example, features illustrated or described as part of one embodiment can be used with another embodiment to generate a still further embodiment. For clarity, some features of the actual implementation described in this specification can be omitted.

In addition, the terms "first", "second", and the like are only used to distinguish one element from another element. In fact, the first element can also be called the second element and vice versa. It should also be understood that "comprising" and "including" are only used to describe the existence of stated features, elements, functions or components, but do not exclude the presence of one or more other features, elements, functions or components.

In an edge cloud architecture, a pure GPP platform cannot meet real time performance requirements which is a main feature of traditional RAN system. Research has shown that adding hardware accelerators to the GPP platform is a sort of potential option for edge cloud hardware architecture. For instance, a physical layer which has high real-time requirements and complicated encryption algorithms can be implemented in hardware accelerators, while other layers and functions of the RAN can be implemented in the GPP platform. In order to achieve management of a heterogeneous computing resource pool including GPP resources and hardware accelerator resources in edge cloud, the following technical problems need to be solved, for example:

First, all heterogeneous computing resources including GPP and hardware accelerators shall be virtualized and be shared among function entities in an edge cloud. It is easy to implement computing resources virtualization on a GPP platform, such virtualization on a GPP platform can be provided by virtualization software such as KVM, vmWare, Linux Container, etc. However, little research has been done on virtualization of hardware accelerators.

Moreover, since the virtualized GPP resources and virtualized accelerator resources shall act as computing resources for an edge cloud, a unified computing resources controller is needed to manage these resources in the edge cloud.

An alternative scheme for virtualization is to use a control mechanism for all-reconfigurable computing resources, where virtualization of a hardware accelerator is implemented based on an FPGA's partial reconfiguration technology. The all-reconfigurable computing resources may include the partial reconfiguration technology based FPGA resources and virtualization technology based on GPP resources. In an all-reconfigurable cloud RAN, such as reconfigurable FPGA in hardware accelerators and reconfigurable entities of virtual machine in GPP platform, are involved. All the reconfigurable entities connected to internal switching and a reconfiguration controller can communicate with each other. In the virtualization scheme, a reconfiguration link is built with the partial reconfiguration technology to complete a reconfiguration operation from a reconfiguration controller.

FIG. 1 shows a structure of a reconfigurable FPGA 100 and a reconfigurable link 1101. As shown in FIG. 1, in this solution, a double data rate (DDR) memory 101 acts as an external memory and is used to store images of reconfigurable module (RM) temporarily. A reconfiguration controller 120 sends reconfiguration control signaling and images of RM to the reconfigurable FPGA 100 through, e.g., a 10 GbE interface 102. Then, data part of RM, (i.e., the images) are buffered into an external memory such as DDR 101 while the control signaling shall be sent to a partial reconfiguration core (PRC) module 103. When the PRC 103 receives a reconfiguration command, it will obtain the images of the reconfigurable module from the external memory (DDR 101) and then perform module reconfiguration in a selected reconfiguration partition 130 or 140. With the reconfiguration link 110, the modules implemented in the FPGA board 100 can be reconfigured in real time and support live migration among the reconfigurable FPGA 100 and GPP resources (not shown).

Although this solution can realize the virtualization of hardware accelerators, its virtualization structure has the following disadvantages. First, storing images of RM in an external memory such as DDR memory results in occupation of memory resources on the hardware accelerator board and increase of reconfiguration time. Second, since a partial reconfiguration link has the same interface for data flow and image flow, it can bring potential collisions between data packets and image packets, especially when one RM is preparing to be reconfigured in one reconfigurable partition while another RM is running in its own partition of the same FPGA chip.

In addition, for a pure GPP platform, a resource control scheme has been proposed to control CPU resource scheduling and virtual base station migration. In order to reduce tidal effects used by OPEX and CAPEX, a sort of two-level pool resource management mechanism which includes a pool resource manager (PRM) and a local resource manager (LRM) is used. The objective of the PRM is to perform host consolidation and reduce the number of used host (load convergence) in idle hours. In busy hours, virtual BSs hosted by an overloaded machine may be migrated to another machine under the control of the PRM. A main duty of the PRM is responsibility for inter-host virtual BS migration. The objective of the LRM is to handle instantaneous load fluctuation and balance the load between the cores within a host. That is, the main duty of LRM is to perform intra-host virtual BS migration decisions. Based on a CPU usage report from the LRM, the PRM compares each host's processing load with an overloaded threshold and an underload threshold, and then decide to migrate all the virtual BSs to another host. However, there are also some limitations in this scheme. For example, the resources control scheme is for a GPP platform which is to control CPU resources scheduling and virtual base station migration, while the accelerator resources in a Cloud RAN system are not considered, and a method of managing heterogeneous computing resources is not provided.

Embodiments of the present disclosure propose a new mechanism for managing heterogeneous resources in an edge cloud. In general, the solution proposed in this disclosure include: an improved scheme for virtualization of accelerator (such as FPGA-based accelerators), and a resource management solution for unifying heterogeneous computing resources in an edge cloud.

As mentioned above, in an alternative solution for virtualization, the virtualization of accelerator is based on the partial reconfiguration technology, and the partial reconfiguration link includes an external memory, for storing reconfigurable FPGA images. In some embodiments of the present disclosure, the external memory is removed and the reconfigurable FPGA images may be stored in a unified database, rather than in a distributed memory of an accelerator board itself. It can simplify a reconfiguration process and save the time of transferring the images to an external memory.

In addition, in the alternative solution as described above, the partial reconfiguration link has the same interface for data flow and reconfiguration flow, which results in potential conflicts. However, in some embodiments of the present disclosure, an independent interface for partial reconfiguration data and an external communication interface for a reconfigurable module are designed. This makes the partial reconfiguration process have no impact on existing modules running in the same FPGA chip. It can avoid potential data packets collisions and improve the performance of reconfiguration modules In further embodiments of the present disclosure, a new database structure is designed to store both virtual machine (VM) images and RM images. Information items for VM/RM are divided into a static item part and a dynamical item part. The static item part is a module exclusively implemented in a GPP or an accelerator, and the dynamical item part is a part which may be implemented in both GPP and accelerator depending on the configuration of heterogeneous controller. The division makes a control of heterogeneous resources (for example, check resources occupation and power consumption for candidate items) easier.

In another embodiment of the present disclosure, a new mechanism for managing heterogeneous resources in an edge cloud is proposed. This mechanism can be used in combination with the other embodiments described above or can be used alone. In this mechanism, for heterogeneous resources management, the criteria of system QoS prioritization and overall power minimization are adopted. For example, at system deployment stage, a heterogeneous resource controller builds an edge cloud based on system architecture. It obtains the required modules' images and performs configuration in the virtual machines on CPUs or in the reconfigurable partitions on accelerators. With respect to which type of module shall be deployed in the edge cloud, the heterogeneous resource controller may determine based on the following criteria: meet QoS requirements of system first; and then, keep the overall power to a minimum on the premise of QoS requirements are satisfied. For example, at module migration stage based on the system requirements changes, decisions on which module needs to be migrated and where the module is migrated to may also be performed based on the criteria of QoS prioritization and power minimization.

Several example embodiments of the present disclosure will be described below with reference to the drawings.

Figure 2:
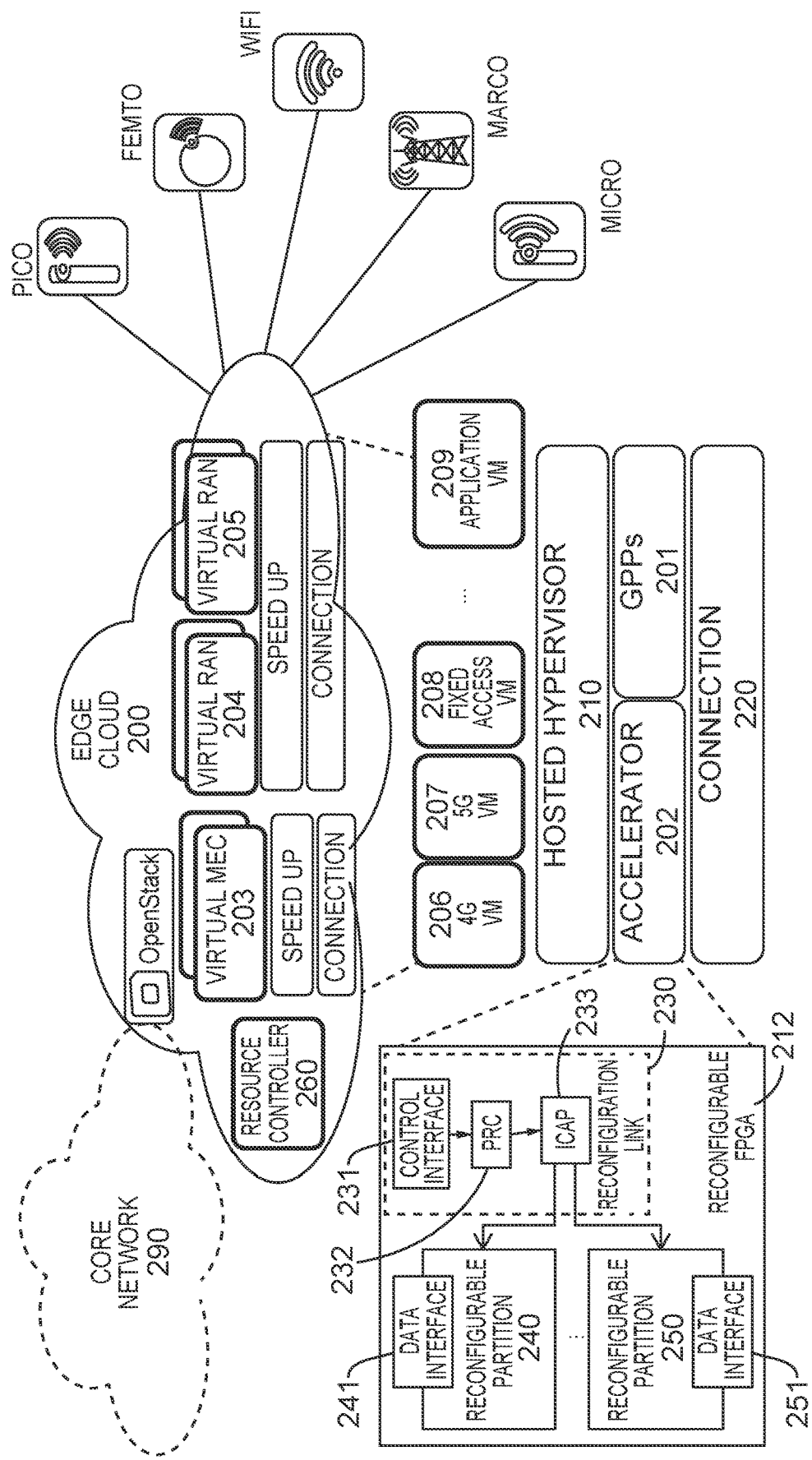
FIG. 2 is a schematic diagram of an edge cloud architecture according to an embodiment of the present disclosure.

An example of architecture 200 of an edge cloud based on heterogeneous computing resources according to one embodiment of the present disclosure is shown in FIG. 2. Virtual radio access network and virtual MEC functional elements are all implemented on heterogeneous computing resources. In the present disclosure, a functional element is also referred to as a functional module or a module.

Considering the power efficiency and processing capacity, the heterogeneous computing resources in the edge cloud 200 include not only a GPP platform 201, but also a hardware accelerator 202. The GPP platform 201 provides virtual CPUs, shared memory and other general-purpose hardware resources. The hardware accelerator 202 provides, for example, a reconfigurable FPGA 212 and its peripherals. Functions or protocol layers having high real-time requirements or high complexity may be implemented in the reconfigurable hardware accelerator 202. Other general-purpose programs and high scalable functions may be implemented on the virtualized GPP platform 201. The hardware accelerator 202 may be connected, to the GPP platform, in a form of, for example, but without limitation, peripheral component interface express (PCIe) cards inserted into servers or act as an independent hardware acceleration array. The interface between the GPP platform 201 and the hardware accelerator 202 may be in PCIe mode or/and 10 GbE mode.

In the edge cloud 200 shown in FIG. 2, a virtual MEC 203 and a virtual RAN 204 or 205 may be implemented in virtual machines 206-209. A hosted hypervisor 210 provides virtualizations and drivers for the virtual machines 206-209. The accelerator 202 and the GPPs 201 provide hardware of the edge cloud. A connection 220 provides a high-speed internal and external connection in the edge cloud. The edge cloud 200 may support access network architectures such as Pico, Femto, WiFi, Marco, Micro, etc. based on dynamical computing resources configuration and reconfiguration. The LTE, 5G fixed access and applications may be implemented in virtual machines, while those high real-time requirement or high complexity functions may be implemented in configurable modules (RM) in the configurable accelerator 202. The edge cloud 200 may be connected to a core network 290.

In some embodiments, the hardware accelerator 202 includes reconfigurable partitions (e.g., 240, 250) with external data interfaces (e.g., 241, 251). Although in FIG. 2 each reconfigurable partition 240-250 is shown as having its own external data interfaces (241, 251), embodiments of the present disclosure are not limited thereto. For example, in another embodiment, multiple reconfigurable partitions may have a common external data interface.

In some embodiments, the hardware accelerator 202 includes a reconfiguration link 230 as shown in FIG. 2. The reconfiguration link 230 includes an external control interface 231 (such as 10 GbE) separated from the external data interfaces (241, 251), a partial reconfiguration core PRC 232 coupled to the external control interface 231, and an Internet content adaptation protocol ICAP port 233 connected to the reconfigurable partitions 240-250.

Figure 3:
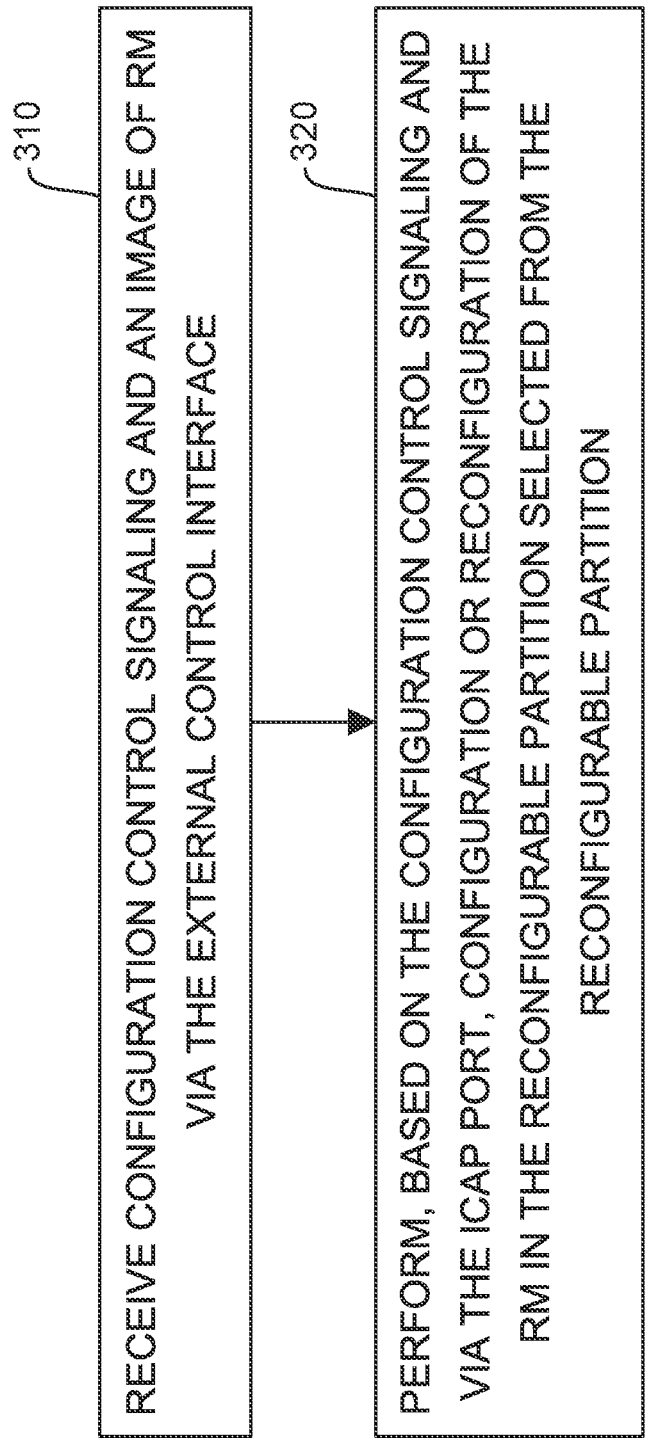
FIG. 3 shows an example operation performed by a PRC in FIG. 2 according to an embodiment of the present disclosure.

In some embodiments, the RM's configuration and reconfiguration in the hardware accelerator 202 may be done through the reconfiguration link 230. For example, the PRC 232 may be configured to perform the operations of blocks 310-320 shown in FIG. 3, that is, at block 310, the configuration control signaling and the image of the RM are received via the external control interface 231, and at block 320, perform, based on the configuration control signaling and via the ICAP port 233, configuration or reconfiguration (e.g., 240) of RM in the reconfigurable partition selected from the reconfigurable partitions 240-250.

Comparing the partial reconfiguration link scheme as shown in FIG. 1, the scheme of embodiment of the present disclosure removes the external memory 101 which is used to buffer the reconfigurable FPGA images. The reconfigurable FPGA images may be obtained from any remote node. The new scheme of the embodiment simplifies the reconfiguration process and saves the delay of transferring the images to an external memory. Alternatively, the reconfigurable FPGA image may be stored in a unified database with the virtual machine images, to facilitate images management.

Moreover, different from the scheme using the same interface between data flow and control flow shown in FIG. 1, in the example embodiment of the present disclosure, an independent interface for data flow and control flow are designed, i.e., the PRC 232 receives configuration control signaling and images of the RM via an external control interface 231 separated from the external data interfaces 241, 251, avoiding conflicts with data transmission. It can improve the performance of reconfiguration modules and simplify interface design.

In some embodiments, the configuration control signaling received by the PRC 232 via the external control interface 231 may be generated based on information on the resources occupation of the RM and/or information on power consumption of the hardware accelerator. The configuration control signaling may come from, for example, the resource controller 260 in the edge cloud 200.

A method of managing resources in an edge cloud architecture (such as the architecture 200 in FIG. 2) in a resource controller according to an embodiment of the present disclosure is described below with reference to FIG. 4, the resources includes hardware accelerator resources and GPP resources. The method 400 may be performed by, for example, the resource controller 260 in FIG. 2 or a unit with similar functions. For the purpose of description, the method 400 is described below with reference to the resource controller 260 and the edge cloud architecture 200 in FIG. 2.

Figure 4:
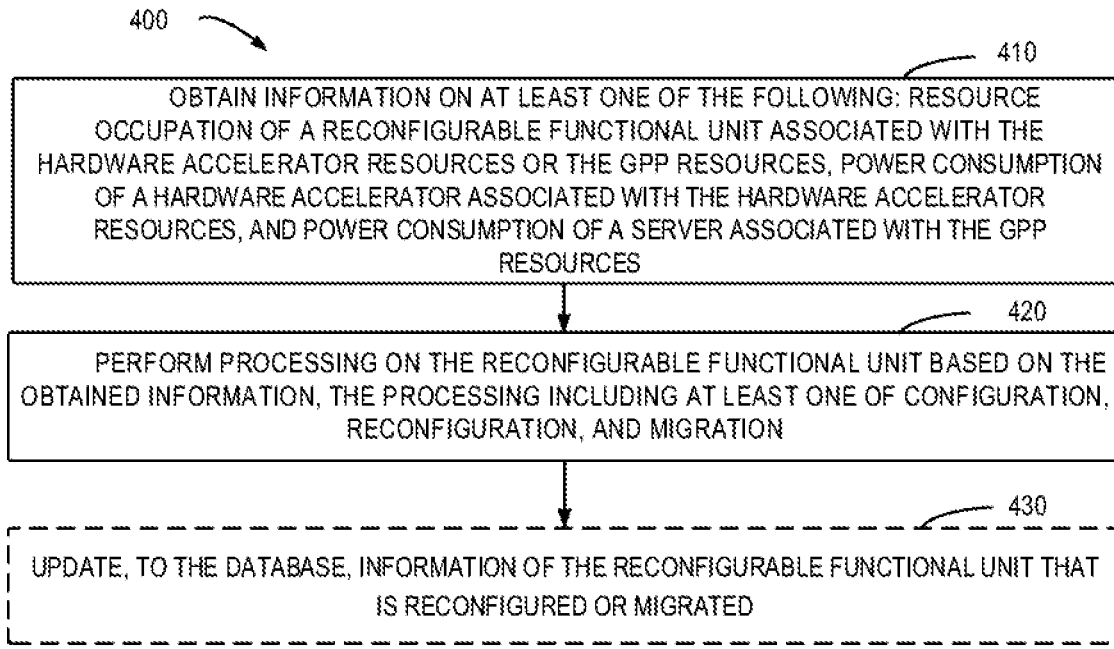
FIG. 4 is a flowchart illustrating a method for resource management in an edge cloud according to an embodiment of the present disclosure.

As shown in FIG. 4, at block 410, the resource controller 260 obtains at least one of the following information: the resource occupation of the reconfigurable functional unit associated with the hardware accelerator resources 202 or the GPP resources 201, power consumption of the hardware accelerator 212 associated with the hardware accelerator resources 202, and the power consumption of the server associated with the GPP resources 201. At block 420, the resource controller 260 performs processing on the reconfigurable functional unit based on the obtained information, and the processing includes at least one of configuration, reconfiguration, and migration. The reconfigurable functional unit may be, for example, but not limited to, RM or VM.

In some embodiments, the edge cloud architecture 200 further includes a first agent associated with the hardware accelerator resources 202 and a second agent associated with the GPP resources 201. Moreover, in this embodiment, at block 410, the resource controller 260 may obtain information on the resource occupation and the power consumption of the associated hardware accelerator or server from the first agent and the second agent.

Figure 5:
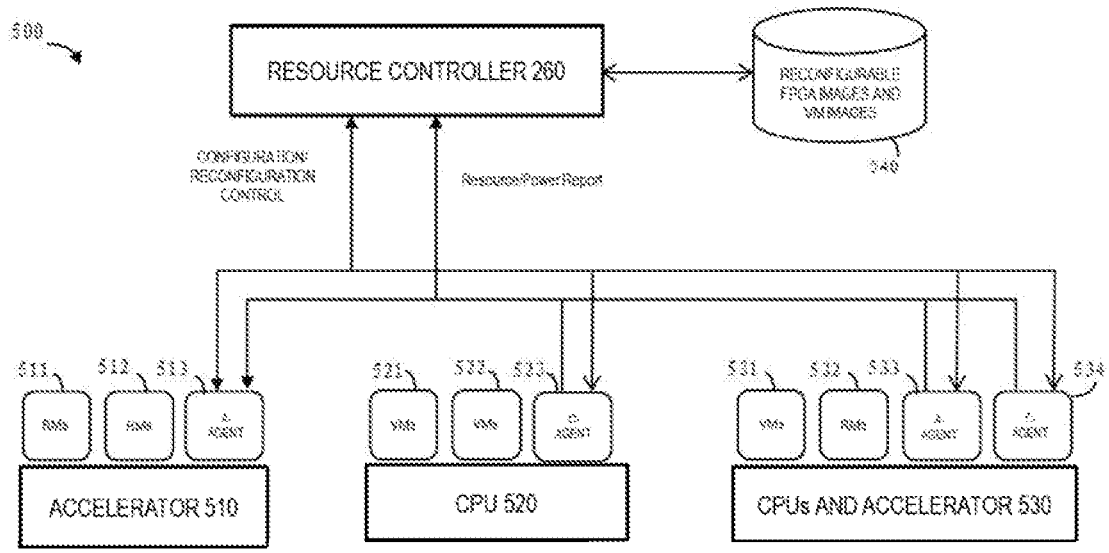
FIG. 5 illustrates an example system structure for resource management in an edge cloud according to an embodiment of the present disclosure.

FIG. 5 illustrates an example system structure 500 for resource management in an edge cloud according to an embodiment of the present disclosure. In FIG. 5, examples of various heterogeneous resources are shown. The heterogeneous resource controller 260 controls configuration/reconfiguration/migration of the reconfigurable functional unit (e.g., RM/VM) based on a resource occupation and power consumption report from each agent. In case of the hardware accelerator 510 is implemented as an accelerator array, there may be the agent 513 (may be referred to as a-Agent) located at an accelerator 501, and responsible for configuration/reconfiguration/migration of RM and reporting resource occupation of each RM and power consumption of each accelerator 510. In case of pure GPP resources, there may be an agent 520 (may be referred to as c-Agent) located at a server and responsible for controlling VM configuration/reconfiguration/migration and reporting resource occupation of each VM and power consumption of each server. In case of GPP with the accelerator PCIe card 530 (i.e., a combination of hardware accelerator and GPP through a PCIe card), there may be both a c-Agent 534 in the server and an a-Agent 533 in the accelerator card. The two agents 533 and 534 control their accelerator card and its server, respectively.

In one embodiment, at block 410, the resource controller 260 may send a resource occupation and power consumption report request to, for example, the agent 513 (or 533) and/or the agent 523 (or 534); and receive a resource occupation and power consumption report as a response to the request from the agent 513 and/or the agent 523 report.

Alternatively or additionally, in another embodiment, at block 410, the resource controller 260 may obtain information on resource occupation and power consumption by receiving an external control signal from an external control module (not shown).

In yet another embodiment, at block 410, the resource controller 260 may obtain information on resource occupation and power consumption from a database. The database may be, for example, the database 540 in FIG. 5. By way of example, but not limitation, at block 410, the resource controller 260 may send an initial deployment request to the database 540, where the initial deployment request includes a list of reconfigurable functional units; and the resource controller 260 may receive information on resource occupation and power consumption of reconfigurable functional units from the database 540 specified in the list.

Figure 6:
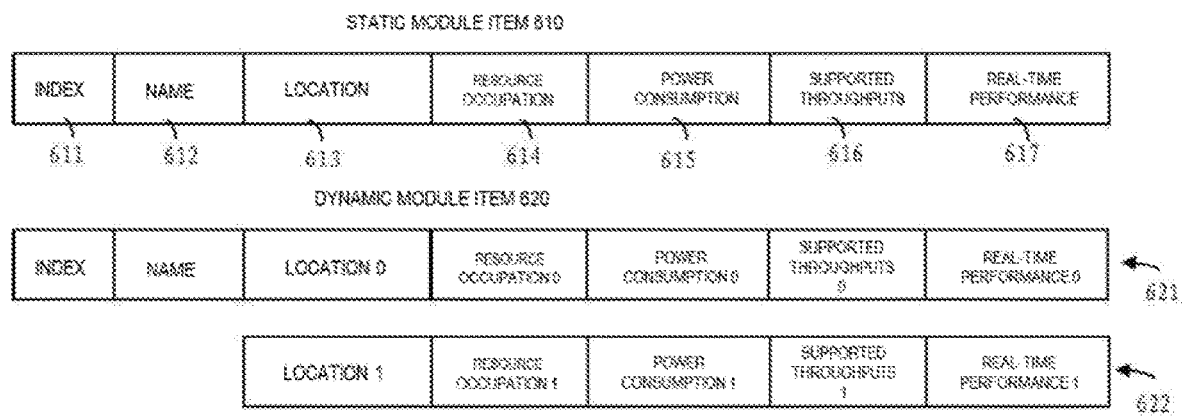
FIG. 6 illustrates an example of information entries in a database according to an embodiment of the present disclosure.

In some embodiments, the database 540 may store implement location, resources occupation, power consumption and relevant RM/VM images of the reconfigurable functional units. Optionally, to facilitate information management, the database may be divided into two parts, the two parts include information on a static functional unit that can be deployed only in hardware accelerator resources or only in the GPP resources, and information on a dynamic functional unit that can be deployed in either the GPP resources or the hardware accelerator resources according to a system requirement. FIG. 6 shows an example of an information item 610 for the static module and an information item 620 for the dynamic module.

As shown in FIG. 6, the information item 610 for the static functional unit may include (but is not limited to): an index 611, a name 612, a location 613, a resource occupation 614, a power consumption 615, and a supported throughput 616 and a real-time performance 617 of the static functional unit. The "location" 613 indicates where the static functional unit is configured or reconfigured (GPP or accelerator). The "resource occupation" 614 and "power consumption" 615 indicates the occupied CPU/FGPA resources and power consumption when the static functional unit is configured/reconfigured. The "supported throughputs" 616 and "real-time performances" 617 indicate QoS parameters. It should be understood that in some embodiments, some information in the item 610 may be omitted and/or the item 610 may include additional information.

In addition, the information item 620 for the dynamic functional unit includes: an index, a name of the dynamic functional unit, and respective locations, resource occupation, power consumption, supported throughputs, and real-time performances of the dynamic functional unit when deployed in the hardware accelerator resources and in the GPP resources. Part 621 records the position/resource occupation/power consumption/performance when the dynamic functional unit is configured/reconfigured in the FPGA of the accelerator; and part 622 records the position/resource occupation/power consumption/performance when the dynamic functional unit is configured/reconfigured in the GPP.

Now return to FIG. 4. In one embodiment, at block 420, the resource controller 260 may perform configuration, reconfiguration, or migration of the reconfigurable functional unit based on the obtained information such that a system quality of service (QoS) is prioritized and an overall power meets a predetermined requirement. For example, the resource controller 260 may perform the configuration, reconfiguration, or migration of the reconfigurable functional unit based on the obtained information according to the criteria of quality of service (QoS) prioritization and power minimization. That is, in one embodiment, when managing computing resources of the edge cloud, the resource controller 260 may meet two criteria: the first criterion is QoS prioritization, which means that the QoS requirements of a system shall be met first when performing a heterogeneous resources configuration/reconfiguration operations; the second criterion is power minimization, which means that when deploying a system or making a dynamic configuration/reconfiguration, on the premise of QoS requirements satisfaction, it shall keep the overall power to a minimum.

As an example, at block 420, the resource controller 260 may determine (the list of) reconfigurable functional units to be configured, reconfigured, or migrated based on the obtained information in accordance with the criteria of QoS prioritization and power minimization; obtaining an image of the determined reconfigurable functional unit from a database; and performing configuration, reconfiguration, or migration of the determined reconfigurable functional unit with the obtained image.

Alternatively or additionally, in some embodiments, the resource controller 260 may perform the configuration, reconfiguration, or migration of the determined reconfigurable functional unit through an agent (e.g., 513-5124 in FIG. 5). For example, the resource controller 260 may send a reconfiguration operation request to the agent associated with the corresponding resource based on one or more predetermined criteria to perform a reconfiguration or migration operation on the determined reconfigurable functional unit. Examples of such criteria include, but are not limited to:

☐Criteria 1: When the overall system resource occupation is below the first threshold, the reconfiguration or migration operation should reduce the number of hardware accelerators or servers used by the reconfigurable functional units, that is, the reconfigurable functional units is concentrated into fewer hardware accelerators or servers to realize power minimization, and☐

Criteria 2: When the overall system resource occupation exceeds the second threshold, the reconfiguration or migration operation increases the number of hardware accelerators or servers to which the reconfigurable functional units are distributed, that is, the reconfigurable functional units are distributed to more hardware accelerator or server to meet a system requirement.

There is a tidal effect on resource (daylight to night), thus in order to save the overall power of system, when the overall system resource occupation is below a resource threshold (threshold-Low), the resource controller 260 may calculate the overall power consumption of system based on a report from an agent and select the best configuration list to meet the overall power consumption minimization. The resource controller 260 may send the "dynamical reconfiguration request" to a database 540 to request the determined images of the reconfigurable functional unit and read the images of the requested reconfigurable functional unit from the database 540. Once obtaining one complete image from the database 540, the resource controller 260 may start the VM/RM reconfiguration/migration by sending the "dynamical reconfiguration operation request" to a corresponding agent. The VMs and RMs may be concentrated into fewer servers or fewer accelerators through this reconfiguration or migration so that idle servers and idle accelerators may enter power-saving mode. In some embodiments, in order to save more power of system, even some VMs implemented on GPP before may be migrated to RMs on accelerators, and vice versa.

Optionally, when the agent finishes the VM/RM reconfiguration/migration operation one by one or in a parallel manner, it may send the "dynamical reconfiguration operation complete" to the resource controller 260 to notify that the reconfiguration/migration operation has been completed. That is, the resource controller 260 may optionally receive a reconfiguration/migration operation completion message from the agent.

Similarly, based on a tidal effect (night to daylight), in order to save overall power of system, when an overall system resource occupation exceeds a resource threshold (threshold-High), a similar process as above may be performed by the resource controller 260. Alternatively, when a reconfiguration/migration operation is completed, the VMs and RMs are spread on more servers or more accelerators to meet a system requirement.

In some embodiments, the method 400 may further include a block 430, where the resource controller 260 updates the database 540 with information on the reconfigurable or migrated reconfigurable functional units. For example, an agent (513, 523, 533, or 534) may send the resource/power report of the reconfigurable or migrated reconfigurable functional unit back to the resource controller 260, and then the resource controller 260 may notify the database 540 to complete an item update operation.

Figure 7:
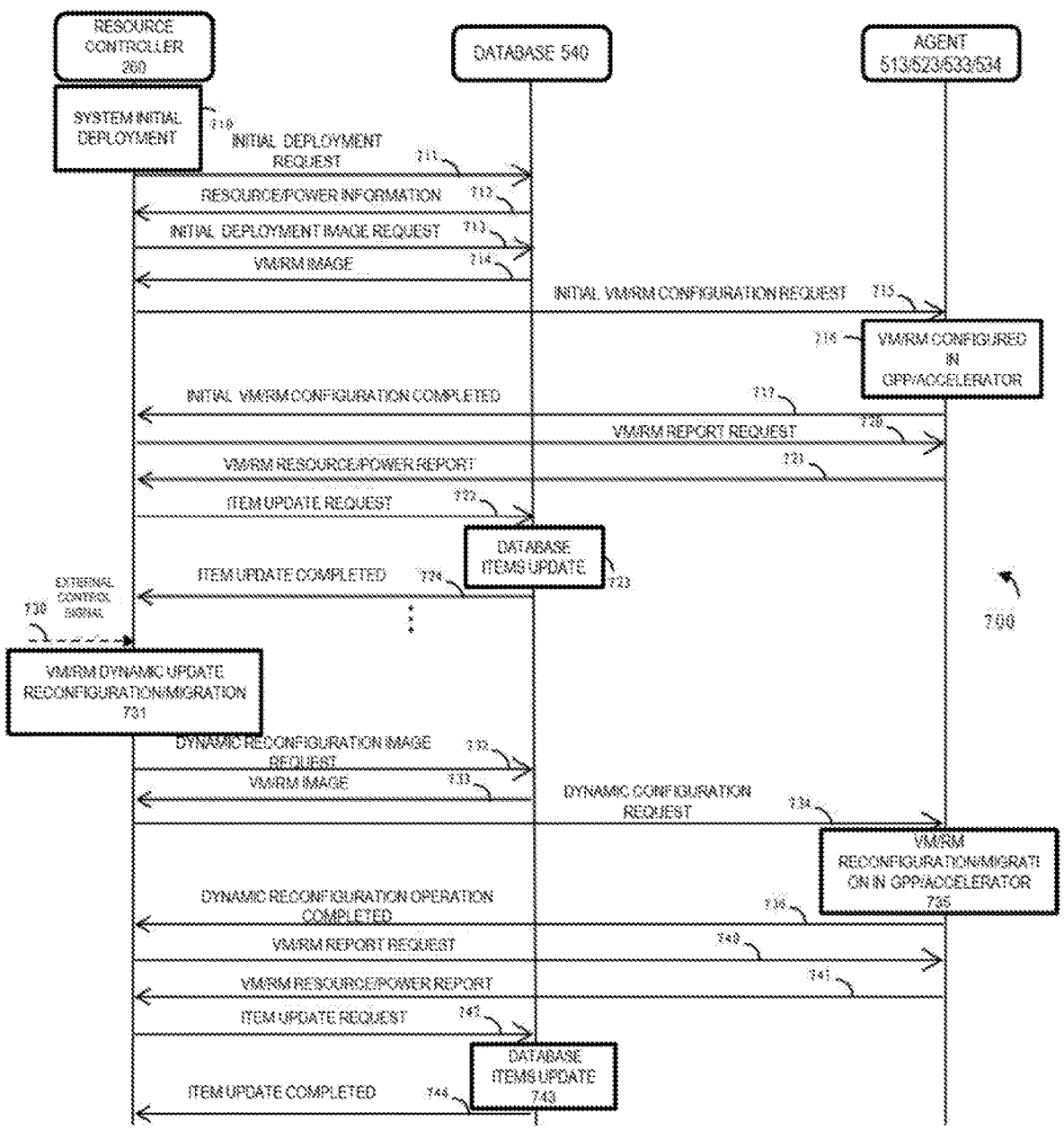
FIG. 7 illustrates an example processing for resource management in an edge cloud according to an embodiment of the present disclosure.

FIG. 7 illustrates an example process 700 for resource control in an edge cloud according to an embodiment of the present disclosure. This process may be seen as a specific embodiment of the method 400. This example process involves a signaling process among the resource controller 260, the database 540, and an agent (one or more of 513, 523, 533, and 534).

In this example embodiment, at a system initial deployment stage, the resource controller 260 triggers an initial deployment (710). The resource controller 260 sends (711) an "initial deploy request" to database 540, where the initial deploy request includes a configuration modules list. Once the database 540 receives this request, it will send the required information on resources occupation information and power consumption of configuration modules back (712) to the resource controller 260 by "resources/power information". The resource controller 260 may calculate (not shown) all the provided throughputs and make a real-time performance analysis.

If the QoS of system can be satisfied, the resource controller 260 may send (713) an "initial deploy images request" to the database 540 and read (714) the images in the request list (e.g., one by one). Once obtaining one complete images from the database 540, the resource controller 260 may send (715) an "initial VM/RM configuration request" to a corresponding agent (513, 523, 533 or 534) to build a VM in a dedicated GPP platform or to build a RM in dedicated accelerators. The relevant agent (513, 523, 533 or 534) configures (716) a virtual machine or RM in GPP/accelerators and sends (717) an "initial VM/RM configuration complete" to the resource controller 260 to notify that an initial deployment has been completed. The requested VM and RM shall (e.g., one by one) finish the configuration as described above.

If the QoS of the system cannot be satisfied, the resource controller 260 may select another configuration list and do the above process again.

After the configuration/reconfiguration, the resource controller 260 may send (720) a "VM/RM report request" to a specified agent or to each agent (e.g., periodically) and receive (721) a resource occupation and power consumption report from the agent. Then the resource controller 260 may send (722) an "item update request" to the database 540 to update the item information of the respective VM or RM images. The database 540 performs an update (723) of the database items, and sends (724) an "item update complete" message to the resource controller 260. This operation may be performed periodically.

After the initial configuration, the resource controller 260 may perform a dynamical reconfiguration/migration (731) of VMs and/or RMs. The dynamical reconfiguration/migration may be triggered by an external signal (730) or a resource/power report from an agent (513, 523, 533 or 534).

For example, based on a tidal effect (daylight to night), when the overall system resource occupation is below a resource threshold (threshold-Low), the resource controller 260 may calculate the overall power consumption of system based on a report from an agent and select a best configuration list to meet the overall power consumption minimization. Then the resource controller 260 may send (732) a "dynamical reconfiguration request" to the database 540 and start to read (733) the requested images from the database 540. Once obtaining one complete image from the database, the resource controller 260 may start the VM/RM reconfiguration/migration by sending (734) a "dynamical reconfiguration operation request" to a corresponding agent. When the agent finishes each specified VM/RM reconfiguration/migration operation (735), a "dynamical reconfiguration operation complete" is sent (736) to the resource controller 260 to notify that the reconfiguration/migration operation has been completed. Afterwards, the VMs and RMs are concentrated on fewer servers and fewer accelerators. In one embodiment, in order to save power of the system, even some VMs implemented on GPP before may be migrated to RMs on accelerators. As a result, idle servers and idle accelerators can enter power-saving mode.

Similar to 721-724, the resource controller 260 may send (740) a "VM/RM report request" to a specified agent or to each agent and receive (741) a resource occupation and power consumption report. Then, the resource controller 260 may send (742) an "item update request" to the database 540 to update the item information of the respective VM/RM images. The database 540 performs an update (743) of the database items, and sends (744) an "item update complete" message to the resource controller 260.

It should be understood that, based on a tidal effect (night to daylight), in order to save power of the system, when an overall system resources occupation exceeds a resource threshold (threshold-high), a similar process as above shall be performed. Alternatively, when reconfiguration/migration operation is completed, the VMs and RMs are spread on more servers and more accelerators to meet a system requirement.

In the case where the reconfiguration/migration may be triggered by external signals, an external control module may also a trigger system reconfiguration/migration operation through an external control entity such as orchestrator of OpenStack. For example, if an emergency high-performance communication link needs to be built-up in an edge cloud, the external orchestration controller may send a reconfiguration/migration signal to the resource controller 260, which will search idle resources and/or concentrate the heterogeneous computing resources to build up a high quality communication link for special emergency requirements.

Figure 8:
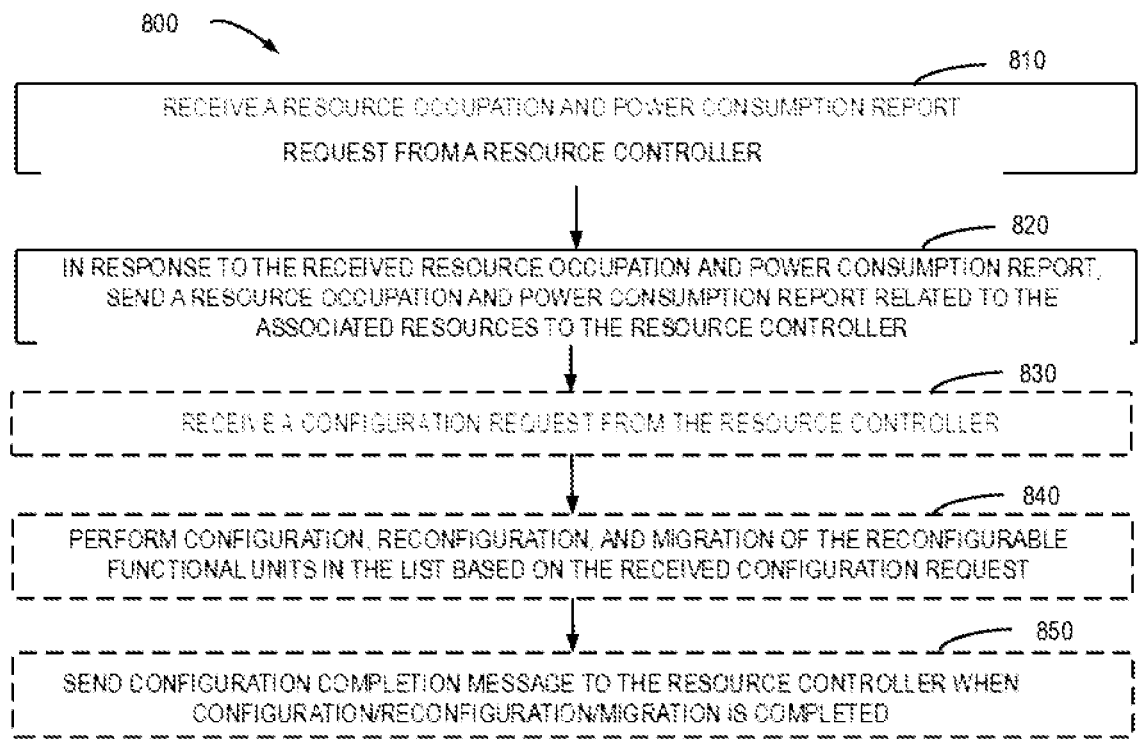
FIG. 8 is a flowchart illustrating another method for resource management in an edge cloud according to an embodiment of the present disclosure.

FIG. 8 will be referenced below, which is a flowchart illustrating another method of managing an edge cloud architecture (such as the architecture 200 in FIG. 2) according to an embodiment of the present disclosure. The resources may include, for example, hardware accelerator resources and GPP resources. In addition, the edge cloud architecture further includes a first agent (for example, 513 or 533 in FIG. 5) associated with the hardware accelerator resources, and a second agent (for example, 523 or 534 in FIG. 5) associated with the GPP resources. The method may be performed at the first agent or the second agent. For the purpose of description, the embodiments will be described in conjunction with the agents 511/323 and the example architecture 500 in FIG. 5, however, as those skilled in the art can understand based on the teachings herein, the method may also be used in other apparatuses with similar functions.

As shown in FIG. 8, at block 810, the agent 513/523 receives a resource occupation and power consumption report request from the resource controller 260; and at block 820, in response to the received resource occupation and power consumption report request, the agent 511/323 sends a resource occupation and power consumption report related to the associated resources to the resource controller 260.

The sending of the resource occupation reports and power consumption report enable the resource controller 260 to effectively control the reconfiguration or migration of the reconfigurable functional unit RM or VM, thereby achieving efficient use of resources and reducing system energy consumption.

In one embodiment, alternatively or additionally, the agent 511/323 may perform reconfiguration or migration of the reconfigurable functional unit RM or VM under a control of the resource controller 260. In this embodiment, at block 830, the agent 513/523 may receive a configuration request from the resource controller 260, the configuration request includes a list of reconfigurable functional units to be configured, reconfigured, or migrated; at block 840, based on the received configuration request, the agent 513/523 performs configuration, reconfiguration, or migration of the reconfigurable functional units in the list. Optionally, when the configuration, reconfiguration, or migration is completed, the agent 513/523 may send a configuration completion message to the resource controller 260 at block 850. An example of this operation has been described above in connection with 715-717 or 734-736 of FIG. 7.

Figure 9:
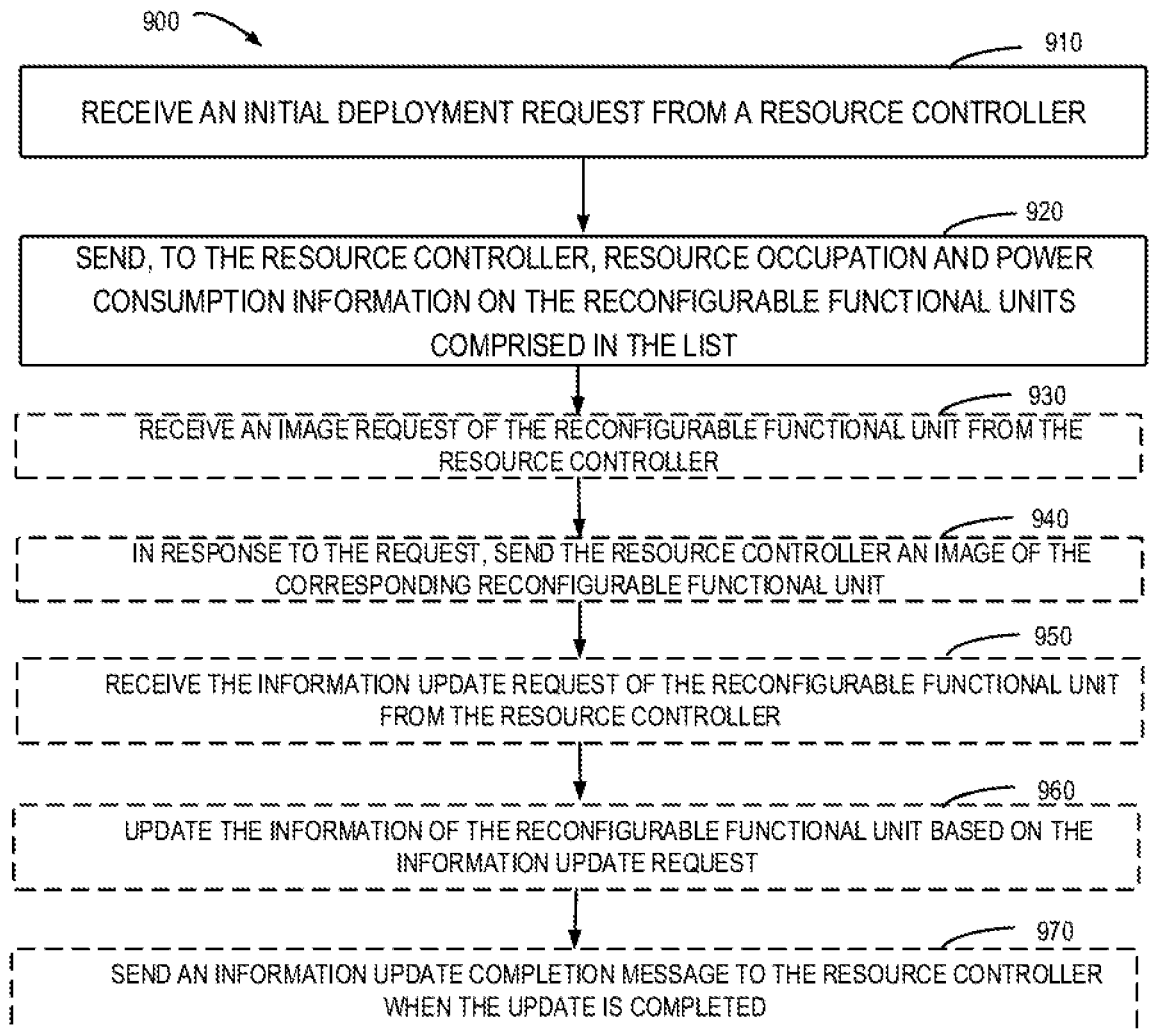
FIG. 9 is a flowchart illustrating a further method for resource management in an edge cloud according to an embodiment of the present disclosure.

FIG. 9 illustrates yet another method 900 of managing resources in an edge cloud architecture, such as the architecture 200 in FIG. 2, according to an embodiment of the disclosure. The resources may include, for example, hardware accelerator resources and GPP resources. This method may be performed in a database (e.g., the database 540 in FIG. 5). For the purpose of illustration, the embodiments will be described in conjunction with the database 540 and the example architecture 500 in FIG. 5. However, as those skilled in the art can understand based on the teachings herein, the method can also be performed at other apparatuses with similar functions.

As shown in FIG. 9, at block 910, the database 540 receives an initial deployment request from the resource controller 260, where the initial deployment request includes a list of reconfigurable functional units; and at block 920, the database 540 sends to the resource controller 260 information on the resource occupation and power consumption of the reconfigurable functional units included in the list.

The sending of the resource occupation reports and power consumption report enable the resource controller 260 to effectively control the configuration, reconfiguration, or migration of the reconfigurable functional unit RM or VM, thereby achieving efficient use of resources and reducing system energy consumption.

In one embodiment, information items in the database may have the structure shown in FIG. 6, that is, the information on the database is divided into information on a static functional unit and information on a dynamic functional unit. This structure facilitates management and control of information.

In another embodiment, alternatively or additionally, the database 540 may receive an image request for the reconfigurable functional unit from the resource controller 260 at block 930; and at block 940, in response to the request, sending, to the resource controller 260, an image of the corresponding reconfigurable functional unit.

Compared to the scheme of using DDR 101 to store images of configurable functional units in FIG. 1, storing images of configurable functional units in the database 540 can simplify the reconfiguration process and save the time delay for transferring images to an external memory.

In yet another embodiment, alternatively or additionally, the data 540 may receive an information update request of the reconfigurable functional unit from the resource controller 260 at block 950; and updating information of the reconfigurable functional unit based on the information update request at block 960 (for example, one or more of resource occupation, power consumption, and images). Optionally, at block 970, when the update is completed, the database 540 may send an information update completion message to the resource controller 260.

A structure of a first example apparatus for managing resources in an edge cloud architecture will be described below. The edge cloud architecture may be, for example (but not limited to), as shown in FIG. 2, and the resources may include hardware accelerator resources and GPP resources. The first example apparatus 1 may be implemented as a resource controller (e.g., the resource controller 260 in FIG. 2 or FIG. 5) or a part thereof. The first example apparatus may perform the method 400 described with reference to FIG. 4, but is not limited to performing the method 400. Likewise, the method 400 may be performed by the first example apparatus, but is not limited to be performed by the first example device. For example, at least some operations of the method 400 may be performed by other apparatus.

The first example apparatus may include an information acquisition unit and a configuration control unit. The information acquisition unit is configured to acquire at least one of the following information: resource occupation of a reconfigurable functional unit associated with the hardware accelerator resources or the GPP resources, power consumption of a hardware accelerator associated with the hardware accelerator resource and the power consumption of a server associated with the GPP resources. The configuration control unit is configured to perform processing on the reconfigurable functional unit based on the obtained information; the processing includes at least one of configuration, reconfiguration, and migration.

The descriptions related to information obtaining and configuration control (such as the operations of blocks 410-420) given in connection with method 400 are equally applicable here and are not repeated for the purpose of brevity.

In another embodiment, the first example apparatus may further include an information update control unit configured to update, to a database, information of the reconfigurable functional unit that is reconfigured or migrated (e.g., the database 540 of FIG. 5).

A structure of a second example apparatus for managing resources in an edge cloud architecture according to an embodiment of the present disclosure will be described below. The edge cloud architecture may be, for example (but not limited to), as shown in FIG. 2, and the resources may include hardware accelerator resources and GPP resources. The edge cloud architecture also includes a first agent associated with hardware accelerator resources and a second agent associated with GPP resources. This second example apparatus may be implemented as a first agent or a second agent (e.g., 513-533, 534 in FIG. 5) or a part thereof. The second example apparatus may perform the method 800 described with reference to FIG. 8, but is not limited to performing the method 800. The method 800 may also be performed by the second example device, but is not limited to be performed by the second example device. For example, at least some operations of method 800 may be performed by other devices.

The second example apparatus may include a first receiving unit and a first transmitting unit. The first receiving unit is configured to receive a resource occupation and power consumption report request from a resource controller. The first sending unit is configured to send a resource occupation and power consumption report related to the associated resource to a resource controller in response to a resource occupation and power consumption report request.

In another embodiment, the second example apparatus may alternatively or additionally include a second receiving unit, a configuration unit, and a second sending unit. The second receiving unit may be configured to receive a configuration request from the resource controller, and the configuration request includes a list of reconfigurable functional units to be configured, reconfigured, or migrated. The configuration unit may be configured to perform configuration, reconfiguration, and migration of the reconfigurable functional units in the list based on the received configuration request. The second sending unit may be configured to send a configuration completion message to the resource controller when the configuration, reconfiguration, or migration is completed.

The agent-related descriptions provided in conjunction with the methods 400, 800 and FIGS. 4, 7, and 8 are also applicable here, and will not be repeated.

A structure of a third example apparatus for managing resources in an edge cloud architecture according to an embodiment of the present disclosure will be described below. The edge cloud architecture may be, for example (but not limited to), as shown in FIG. 2, and the resources may include hardware accelerator resources and GPP resources. This third example device may be implemented as a database (e.g., 540 in FIG. 5) or a part thereof. The third example device may perform the method 900 described with reference to FIG. 9, but is not limited to performing the method 900. The method 900 may also be performed by the third example device, but is not limited to be performed by the third example device. For example, at least some operations of method 900 may be performed by other devices.

The third example apparatus may include a receiving unit and a transmitting unit. The receiving unit may be configured to receive an initial deployment request from the resource controller, where the initial deployment request includes a list of reconfigurable functional units, and the sending unit may be configured to send information on the resource occupation and power consumption of the reconfigurable functional units included in the list to the resource controller.

In one embodiment, the third example device may separately store the information on the static functional unit and the information on the dynamic functional unit to facilitate management. Each of the information on the static functional unit and the information on the dynamic functional unit may have, for example, but not limited to, the structure shown in FIG. 6 separately.

In another embodiment, the receiving unit may be further configured to receive an image request of the reconfigurable functional unit from the resource controller. The sending unit may be further configured to send images of reconfigurable function unit to the resource controller in response to the image request.

Alternatively or additionally, in another embodiment, the third example apparatus may further include an update request receiving unit, an update unit, and a reporting unit. The update request receiving unit may be configured to receive an information update request of the reconfigurable functional unit from the resource controller. The update unit may be configured to update the information of the reconfigurable functional unit based on the information update request. The reporting unit may be configured to send an information update completion message to the resource controller when the update is completed.

The database-related descriptions provided in combination with the methods 400, 900 and FIGS. 4, 7, and 9 are also applicable here, and will not be repeated.

Figure 10:
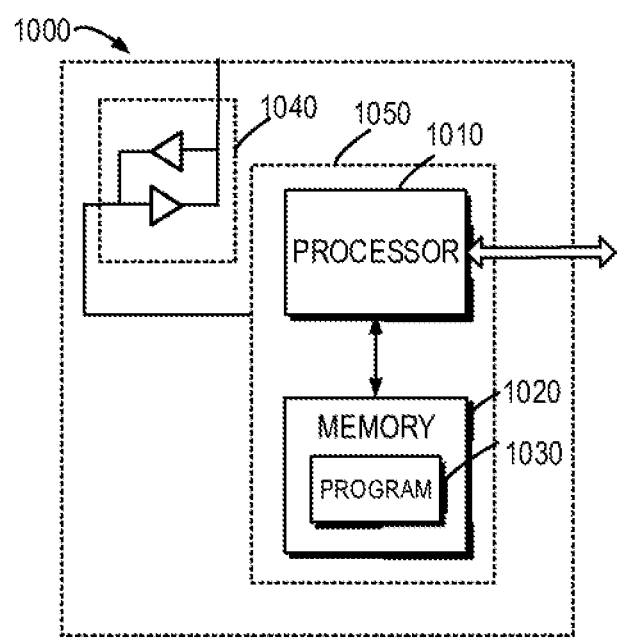
FIG. 10 is a schematic structural diagram illustrating another apparatus for resource management in an edge cloud according to an embodiment of the present disclosure.

FIG. 10 illustrates a simplified block diagram of an apparatus 1000 suitable for implementing embodiments of the present disclosure. The device 1000 may be used to implement a reconfiguration link (e.g., the reconfiguration link 230 in FIG. 2), a resource controller (e.g., the resource controller 260 in FIG. 5), or an agent (e.g., agents 513, 513, 533, 534 in FIG. 5) a database (e.g., the database 540 in FIG. 5), or a portion thereof which are operated as described above. As shown, the device 1000 includes one or more processors 1010, one or more memories 1020 coupled to the processor 1010, and one or more transmitters and/or receivers (TX/RX) 1040 coupled to the processor 1310.

The processor 1010 may be any suitable type suitable for a local technical environment and may include, but is not limited to, one or more of a general-purpose computer, a special-purpose computer, a microcontroller, a digital signal controller (DSP), and a controller based multi-core controller architecture. The apparatus 1000 may also include a plurality of processors, such as a dedicated integrated circuit; the dedicated integrated circuit is temporally subordinate to a clock belonging to a synchronous master processor.

The memory 1020 may be any type suitable for a local technical environment, and may be implemented using any suitable data storage technology. As a non-limiting example, it may include, for example, a non-transitory computer-readable media, a semiconductor-based storage device, a magnetic storage device and system, an optical storage device and system, a fixed memory, and a removable memory. Although only one memory unit is shown in FIG. 10, there may be multiple physically different memory units in the device 1000.

The memory 1020 stores at least a part of the program 1030. TX/RX 1040 is used for bilateral communication. The communication interface in the figure may represent any interface required for communication with other network elements.

The program 1030 includes program instructions that, when executed by an associated processor, cause the device 1000 to perform operations according to embodiments of the present disclosure, as described with reference to FIGS. 2-9. That is, the embodiments of the present disclosure may be implemented by computer software executable by the processor 1010 and the device 1000, or by a combination of software and hardware. For example, when the device 1000 acts as a resource controller, the processor 1010 executes instructions 1030 stored in the memory 1020 so that the resource controller implements the method 400 described above with reference to FIGS. 4-7. All the features described above with reference to FIG. 2 to FIG. 9 are applicable to the device 1000, and details are not described herein again.

An aspect of the present disclosure also provides an edge cloud system. The edge cloud system may have, for example, an architecture shown in FIG. 2 or FIG. 5 and include at least one of a reconfiguration link 230, a first example device, a second example device, a third example device, and the device 1000 for management of resources.

In general, the various example embodiments of the present disclosure may be implemented in hardware or special purpose circuits, software, logic, or any combination thereof. Some embodiments may be implemented in hardware, while other aspects may be implemented in firmware or software which may be executed by a controller, microprocessor, or other computing device. When aspects of embodiments of the present disclosure are illustrated or described as a block diagram, a flowchart, or using some other graphical representation, it will be understood that the blocks, devices, systems, techniques, or methods described herein may be implemented in hardware, software, firmware, dedicated circuits or logic, general-purpose hardware or controllers, or other computing devices, or some combination thereof as non-limiting examples.

As an example, embodiments of the present disclosure may also be described in the context of machine-executable instructions, such as program modules included in a device on a real or virtual processor of a target. Generally, program modules include routines, programs, libraries, objects, classes, components, data structures, etc. that perform particular tasks or implement particular abstract data structures. In various embodiments, the functionality of the program modules may be combined or segmented among the described program modules. The machine-executable instructions for program modules may be executed within a local or distributed device. In a distributed device, program modules may be located in both local and remote storage media.

Computer program code for implementing the methods of the present disclosure may be written in one or more programming languages. These computer program codes may be provided to a processor of a general-purpose computer, special-purpose computer, or other programmable data processing device so that the program code, when executed by the computer or other programmable data processing device, causes the functions/operations specified in a flowchart and/or block diagram are implemented. The program code can be executed entirely on a computer, partly on a computer, as a stand-alone software package, partly on a computer and partly on a remote computer or entirely on a remote computer or server.

In the context of the present disclosure, a machine-readable medium may be any tangible medium that contains or stores a program for or in connection with an instruction execution system, apparatus, or device. The machine-readable medium may be a machine-readable signal medium or a machine-readable storage medium. The machine-readable medium may include, but is not limited to, an electronic, magnetic, optical, electromagnetic, infrared, or semiconductor system, apparatus, or device, or any suitable combination thereof. More detailed examples of machine-readable storage media include electrical connections with one or more wires, portable computer disks, hard disks, a random access memory (RAM), a read-only memory (ROM), an erasable programmable read-only Memory (EPROM or flash memory), an optical storage device, a magnetic storage device, or any suitable combination thereof.

In addition, although operations are depicted in a particular order, this should not be construed as requiring that such operations be performed in the particular order shown or in a sequential order, or that all illustrated operations be performed to obtain a desired result. In some cases, multitasking or parallel processing can be beneficial. Likewise, although the above discussion includes certain specific implementation details, this should not be construed as limiting the scope of any invention or claim, but rather as a description of a particular embodiment that can be directed to a particular invention. Certain features that are described in this specification in the context of separate embodiments can also be implemented in combination in a single embodiment. Conversely, various features that are described in the context of a single embodiment can also be implemented separately in multiple embodiments or in any suitable sub combination.

Although the subject matter has been described in language specific to structural features and/or methodological acts, it is to be understood that the subject matter defined in the appended claims is not limited to the specific features or acts described above. Rather, the specific features and acts described above are disclosed as example forms of implementing the claims.

We claim:

1. An apparatus for managing resources in an edge cloud architecture, the resources comprising hardware accelerator resources, the hardware accelerator resources comprising a reconfigurable partition with an external data interface, and the apparatus comprising:

an external control interface separated from the external data interface, wherein the external control interface and the external data interface are configured to provide independent flow paths of a control flow and a data flow, respectively;

a partial reconfiguration core (PRC) coupled to the external control interface; and an Internet content adaptation protocol (ICAP) port connected to the reconfigurable partition, wherein the ICAP port is connected on the independent control flow between the external control interface and the reconfigurable partition and wherein the PRC is connected on the independent control flow between the external control interface and the ICAP port;

wherein the PRC is configured to:

receive configuration control signaling and an image of a reconfigurable module (RM) via the external control interface, and perform, based on the configuration control signaling and via the ICAP port, configuration or reconfiguration of the RM in the reconfigurable partition, wherein the hardware accelerator resources of the edge cloud architecture are configured to implement a physical layer of a virtual base station of a radio access network.

2. The apparatus of claim 1, wherein the hardware accelerator resources comprise a plurality of reconfigurable partitions and each of the plurality of reconfigurable partitions has a separate external data interface.

3. The apparatus of claim 1, wherein the hardware accelerator resources are hardware resources based on a field programmable gate array (FPGA).

4. The apparatus of claim 1, wherein the configuration control signaling is generated based on at least one of the following:
   information on resource occupation of the RM, and
   information on power consumption of a hardware accelerator.

5. The apparatus of claim 1, wherein the edge cloud architecture further comprises a first agent associated with the hardware accelerator resources and a second agent associated with general-purpose process (GPP) resources.

6. The apparatus of claim 1, wherein the reception of the configuration control signaling and the image of the RM via the external control interface comprises receiving the image from a remote node.

7. The apparatus of claim 1, wherein the reception of the configuration control signaling and the image of the RM via the external control interface comprises receiving the image from a resource controller, wherein the resource controller is coupled to a unified database configured to store the image of the RM.

8. The apparatus of claim 1, wherein the external control interface comprises an Ethernet interface.

* * * * *